(12) United States Patent
Segal et al.

(10) Patent No.: US 7,017,382 B2
(45) Date of Patent: Mar. 28, 2006

(54) METHODS OF FORMING ALUMINUM-COMPRISING PHYSICAL VAPOR DEPOSITION TARGETS; SPUTTERED FILMS; AND TARGET CONSTRUCTIONS

(75) Inventors: Vladimir M. Segal, Veradale, WA (US); Jianxing Li, Spokane, WA (US); Frank Alford, Veradale, WA (US); Stephane Ferrasse, Veradale, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/194,022

(22) Filed: Jul. 11, 2002

(65) Prior Publication Data

US 2002/0174916 A1 Nov. 28, 2002

Related U.S. Application Data

(62) Division of application No. 09/783,377, filed on Feb. 13, 2001.

(60) Provisional application No. 60/193,354, filed on Mar. 28, 2000.

(51) Int. Cl.
*B21C 23/00* (2006.01)

(52) U.S. Cl. .......................... 72/256; 72/253.1; 72/258; 72/700

(58) Field of Classification Search ............... 72/253.1, 72/256, 258, 700; 204/298.12, 298.13; 148/437, 148/549, 550, 552, 689; 420/528, 548, 552
See application file for complete search history.

(56) References Cited

U.S. PATENT DOCUMENTS 4,992,087 A 2/1991 Holscher (Continued)

FOREIGN PATENT DOCUMENTS

EP 521163 * 1/1993

(Continued)

(Continued)

OTHER PUBLICATIONS

Haupt et al., "Drift in film thickness uniformity arising from sputtering target recrystallization", J. Vac. Sci. Technol. A 7(3), May/Jun 1989, pp. 23552358.

(Continued)

*Primary Examiner*—Ed Tolan
(74) *Attorney, Agent, or Firm*—Wells St. John P.S.

(57) ABSTRACT

The invention includes a method of forming an aluminum-comprising physical vapor deposition target. An aluminum-comprising mass is deformed by equal channel angular extrusion. The mass is at least 99.99% aluminum and further comprises less than or equal to about 1,000 ppm of one or more dopant materials comprising elements selected from the group consisting of Ac, Ag, As, B, Ba, Be, Bi, C, Ca, Cd, Ce, Co, Cr, Cu, Dy, Er, Eu, Fe, Ga, Gd, Ge, Hf, Ho, In, Ir, La, Lu, Mg, Mn, Mo, N, Nb, Nd, Ni, O, Os, P, Pb, Pd, Pm, Po, Pr, Pt, Pu, Ra, Rf, Rh, Ru, S, Sb, Sc, Se, Si, Sm, Sn, Sr, Ta, Tb, Te, Ti, Tl, Tm, V, W, Y, Yb, Zn and Zr. After the aluminum-comprising mass is deformed, the mass is shaped into at least a portion of a sputtering target. The invention also encompasses a physical vapor deposition target consisting essentially of aluminum and less than or equal to 1,000 ppm of one or more dopant materials comprising elements selected from the group consisting of Ac, Ag, As, B, Ba, Be, Bi, C, Ca, Cd, Ce, Co, Cr, Cu, Dy, Er, Eu, Fe, Ga, Gd, Ge, Hf, Ho, In, Ir, La, Lu, Mg, Mn, Mo, N, Nb, Nd, Ni, O, Os, P, Pb, Pd, Pm, Po, Pr, Pt, Pu, Ra, Rf, Rh, Ru, S, Sb, Sc, Se, Si, Sm, Sn, Sr, Ta, Tb, Te, Ti, Tl, Tm, V, W, Y, Yb, Zn and Zr. Additionally, the invention encompasses thin films.

18 Claims, 9 Drawing Sheets

U.S. PATENT DOCUMENTS

| | | | |
|---|---|---|---|
| 5,160,388 A | | 11/1992 | Legresy et al. |
| 5,456,815 A | | 10/1995 | Fukuyo et al. |
| 5,500,301 A | | 3/1996 | Onishi et al. |
| 5,513,512 A | | 5/1996 | Segal |
| 5,541,007 A | | 7/1996 | Ueda et al. |
| 5,590,389 A | * | 12/1996 | Dunlop et al. ............ 419/67 |
| 5,600,989 A | * | 2/1997 | Segal et al. ............ 72/253.1 |
| 5,650,958 A | | 7/1997 | Gallagher et al. |
| 5,764,567 A | | 6/1998 | Parkin |
| 5,809,393 A | | 9/1998 | Dunlop et al. |
| 5,850,755 A | | 12/1998 | Segal |
| 5,923,056 A | | 7/1999 | Lee et al. |
| 6,188,176 B1 | | 2/2001 | Nakaya et al. |
| 6,399,215 B1 | * | 6/2002 | Zhu et al. ............ 428/544 |
| 6,423,161 B1 | * | 7/2002 | Yao et al. ............ 148/437 |
| 6,451,179 B1 | | 9/2002 | Xu et al. |
| 6,569,270 B1 | | 5/2003 | Segal ............ 148/670 |
| 6,605,199 B1 | * | 8/2003 | Perry et al. ............ 204/298.13 |
| 6,908,517 B1 | * | 6/2005 | Segal et al. ............ 148/559 |
| 2001/0054457 A1 | | 12/2001 | Segal et al. |
| 2002/0014406 A1 | | 2/2002 | Takashima |
| 2002/0098616 A1 | | 7/2002 | Kordesch |
| 2004/0022662 A1 | | 2/2004 | Lipkin et al. |

FOREIGN PATENT DOCUMENTS

| | | |
|---|---|---|
| JP | 62-235451 | 10/1987 |
| JP | 62-240733 | 10/1987 |
| JP | 7-90566 | 4/1995 |
| JP | 07286268 | 10/1995 |
| JP | 8-64554 | 3/1996 |
| JP | 8-100255 | 4/1996 |
| JP | 2000-176606 | 6/2000 |
| WO | WO 98/24945 | 6/1998 |
| WO | WO 01/29279 A1 | 4/2001 |

OTHER PUBLICATIONS

Ferrasse et al., "Development of a submicrometer-grained microstructure in aluminum 6061 using equal channel angular extrusion", J. Mater. Res. vol. 12, No. 5, May 1997. pp. 1253-1261.

V.M. Segal. "Materials Processing by Simple Shear", Materials Science and Engineering A. vol. 197. 1995, pp. 157-164. (Year is sufficiently early such that the month is not an issue).

F. J. Humphreys et al., "Developing stable fine-grain microstructures by large strain deformation", Phil. Trans. R. Soc. Lond. A, Jun. 15, 1999, vol. 357 #1756, pp. 1663-1681.

S. Ferrasse et al., "Texture evolution during equal channel angular extrusion Part I. Effect of route, number of passes and initial texture", Materials Science and Engineering, vol. 368, Mar. 15, 2004, pp. 28-40.

V.M. Segal, "Equal channel angular extrusion: from macromechanics to structure formation", Materials Science & Engineering A271, Nov. 1, 1999, pp. 322-333.

Ruslan Z. Valiev et al., "SPD-Processed Ultra-Fine Grained Ti Materials for Medical Applications", Advanced Materials & Processes, Dec. 2003, pp. 33-34.

Segal et al., "Plastic Working of Metals by Simple Shear", Russian Metall. vol. 1, pp. 99-105, 1991.

M. Furukawa et al., "Microhardness Measurements and the Hall-Petch Relationship in a Al-Mg Alloy with Submicrometer Grain Size", Acta Mater. vol. 44, No. 11, pp. 4619-4629, 1996.

Yoshinori Iwahashi et al., "Microstructural Characteristics of Ultrafine-Grained Aluminum Produced Using Equal-Channel Angular Pressing", Metallurgical and Materials Transactions, vol. 29A, pp. 2245-2252, Sep. 1998.

S. Ferrasse et al., "ECAE Targets with Sub-Micron Grain Structures Improve Sputtering Performance and Cost-of-Ownership", Semiconductor Manufacturing, vol. 4, Issue 10, Oct. 2003, pp. 76-92.

R.Z. Valiev et al., "Bulk Nanostructured materials from severe plastic deformation", Progress in Materials Science, vol. 45, 2000, pp. 103-189.

R.Z. Valiev et al., "Plastic deformation of alloys with submicron-grained structure", Materials Science and Engineering, A137 (1991) pp. 35-40.

Ferrasse et al., "Microstructure and Properties of Copper and Aluminum Alloy 3003 Heavily Worked by Equal Channel Angular Extrusion", Metallurgical and Materials Transactions, vol. 28A, Apr. 1997, pp. 1047-1057.

"Aluminum and Aluminum Alloys", ASM International, 1993, pp. 88-89 and 639.

V. M. Segal et al., "Processes of Plastic Structure Formation", Science and Engineering, 1994, published in Russia, Chapters 1, 3 and 4, with Statement in Accordance with 37 CFR 1.98(a)(3)(i).

* cited by examiner

METHODS OF FORMING ALUMINUM-COMPRISING PHYSICAL VAPOR DEPOSITION TARGETS; SPUTTERED FILMS; AND TARGET CONSTRUCTIONS

CROSS REFERENCE TO RELATED APPLICATION

This application is a divisional of U.S. patent application Ser. No. 09/783,377 which was filed on Feb. 13, 2001, which claims priority to U.S. Provisional Application Ser. No. 60/193,354 which was filed on Mar. 28, 2000, both of which are incorporated by reference herein.

TECHNICAL FIELD

The invention pertains to methods of forming aluminum-comprising physical vapor deposition targets, and to target constructions. In particular applications, the invention pertains to methods of utilizing equal channel angular extrusion (ECAE) to deform an aluminum-comprising mass in forming a physical vapor deposition (PVD) target for use in the manufacture of flat panel displays (FPDs), such as, for example, liquid crystal displays (LCDs).

BACKGROUND OF THE INVENTION

PVD is a technology by which thin metallic and/or ceramic layers can be sputter-deposited onto a substrate. Sputtered materials come from a target, which serves generally as a cathode in a standard radio-frequency (RF) and/or direct current (DC) sputtering apparatus. For example, PVD is widely used in the semiconductor industry to produce integrated circuits.

A relatively new application for sputtering technologies is fabrication of FPDs, such as, for example, LCDs. The LCD market has experienced rapid growth. This trend may accelerate in the next few years due to the diversified applications of LCDs in, for example the markets of laptop personal computers (PCs), PC monitors, mobile devices, cellular phones and LCD televisions.

Aluminum can be a particularly useful metal in forming LCDs, and it accordingly can be desired to form aluminum-comprising physical vapor deposition targets. The targets can contain a small content (less than or equal to about 100 parts per million (ppm)) of doping elements. The aluminum, with or without small additions of dopants, is generally desired to be deposited to form a layer of about 300 nm which constitutes the reflecting electrode of LCD devices. Several factors are important in sputter deposition of a uniform layer of aluminum having desired properties for LCD devices. Such factors including: sputtering rate; thin film uniformity; and microstructure. Improvements are desired in the metallurgy of LCD aluminum targets to improve the above-discussed factors.

LCD targets are quite large in size, a typical size being 860×910×19 mm$^3$, and are expected to become bigger in the future. Such massive dimensions present challenges to the development of tooling and processing for fabrication of suitable aluminum-comprising targets.

Various works demonstrate that three fundamental factors of a target can influence sputtering performance. The first factor is the grain size of the material, i.e. the smallest constitutive part of a polycrystalline metal possessing a continuous crystal lattice. Grain size ranges are usually from several millimeters to a few tenths of microns; depending on metal nature, composition, and processing history. It is believed that finer and more homogeneous grain sizes improve thin film uniformity, sputtering yield and deposition rate, while reducing arcing. The second factor is target texture. The continuous crystal lattice of each grain is oriented in a specific way relative to the plane of target surface. The sum of all the particular grain orientations defines the overall target orientation. When no particular target orientation dominates, the texture is considered to be a random structure. Like grain size, crystallographic texture can strongly depend on the preliminary thermomechanical treatment, as well as on the nature and composition of a given metal. Crystallographic textures can influence thin film uniformity and sputtering rate. The third factor is the size and distribution of structural components, such as second phase precipitates and particles, and casting defects (such as, for example, voids or pores). These structural components are usually not desired and can be sources for arcing as well as contamination of thin films.

In order to improve the manufacture of LCD targets it would be desirable to accomplish one or more of the following relative to aluminum-based target materials: (1) to achieve predominate and uniform grain sizes within the target materials of less than 100 µm; (2) to have the target materials consist of (or consist essentially of) high purity aluminum (i.e. aluminum of at least 99.99% (4N) purity, and preferably at least 99.999% (5N) purity, with the percentages being atomic percentages); (3) to keep oxygen content within the target materials low; and (4) to achieve large target sizes utilizing the target materials.

The thermomechanical processes (TMP) used traditionally to fabricate LCD targets can generally only achieve grain sizes larger than 200 µm for 5N Al with or without dopants. Such TMP processes involve the different steps of casting, heat treatment, forming by rolling or forging, annealing and final fabrication of the LCD target. Because forging and rolling operations change the shape of billets by reducing their thickness, practically attainable strains in today's TMP processes are restricted. Further, rolling and forging operations generally produce non-uniform straining throughout a billet.

The optimal method for refining the structure of high purity aluminum alloys (such as, for example, 99.9995% aluminum) would be intensive plastic deformation sufficient to initiate and complete self-recrystallization at room temperature immediately after cold working.

Figure 1:
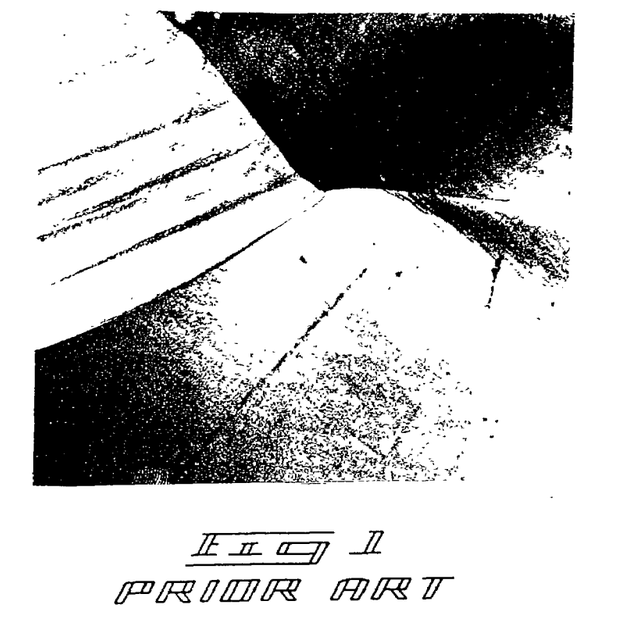
FIG. 1 is an optical micrograph of a cast structure of 99.9995% aluminum (magnified 50 times).
Figure 2:
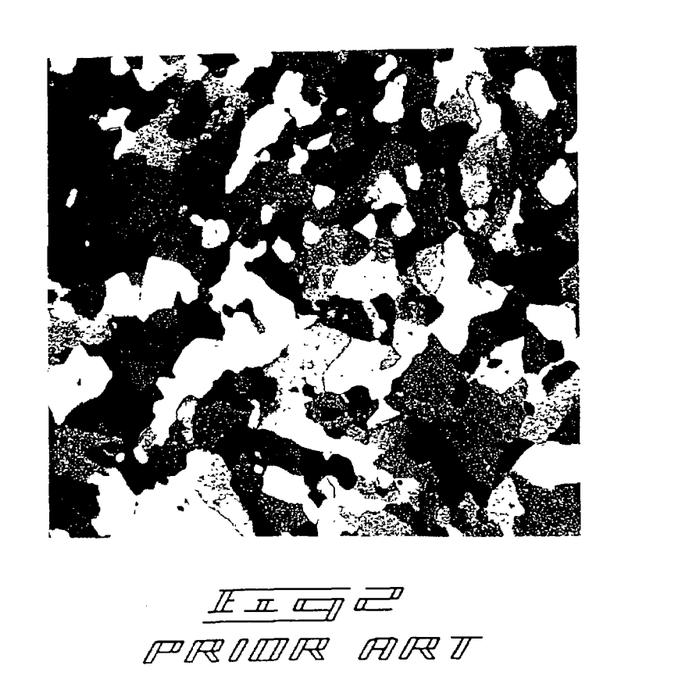
FIG. 2 is an optical micrograph of 99.9995% aluminum showing a self-recrystallized structure after 95% cold rolling reduction (magnified 50 times).
Figure 3:
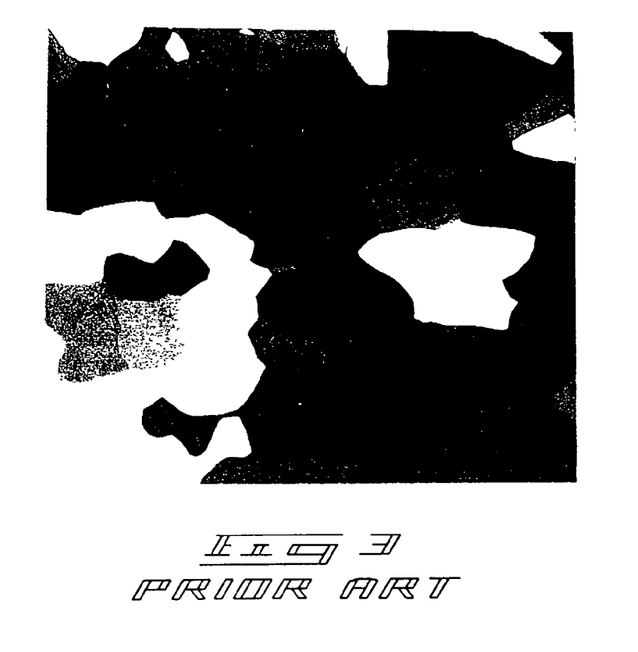
FIG. 3 is an optical micrograph of 99.9995% aluminum illustrating a structure achieved after 95% cold rolling reduction and annealing at 150° C. for 1 hour (magnified 50 times).

High purity aluminum is typically provided as a cast ingot with coarse dendrite structures (FIG. 1 illustrates a typical structure of as-cast 99.9995% aluminum). Forging and/or rolling operations are utilized to deform the cast ingots into target blanks. Flat panel display target blanks are optimally to be in the form of large thin plates. The total strains which can be obtained for any combination of forging and/or rolling operations can be expressed as $\epsilon=(1-h/H_0)*100\%$; where $H_0$ is an ingot length, and h is a target blank thickness. Calculations show that possible thickness reductions for conventional processes range from about 85% to about 92%, depending on target blank size to thickness ratio. The thickness reduction defines the strain induced in a material. Higher thickness reductions indicate more strain, and accordingly can indicate smaller grain sizes. The conventional reductions of 85% to 92% can provide static recrystallization of high purity aluminum (for instance, aluminum having a purity of 99.9995% or greater) but they are not sufficient to develop the fine and uniform grain structure desired for flat panel display target materials. For example, an average grain size after 95% rolling reduction is about 150 microns (such is shown in FIG. 2). Such grain size is larger than that which would optimally be desired for a flat panel display. Further, the structures achieved by conventional processes are not stable. Specifically, if the structures are heated to a temperature of 150° C. or greater (which is a typical temperature for sputtering operations), the average grain size of the structures can grow to 280 microns or more (see FIG. 3). Such behavior occurs even after intensive forging or rolling.

Figure 4:
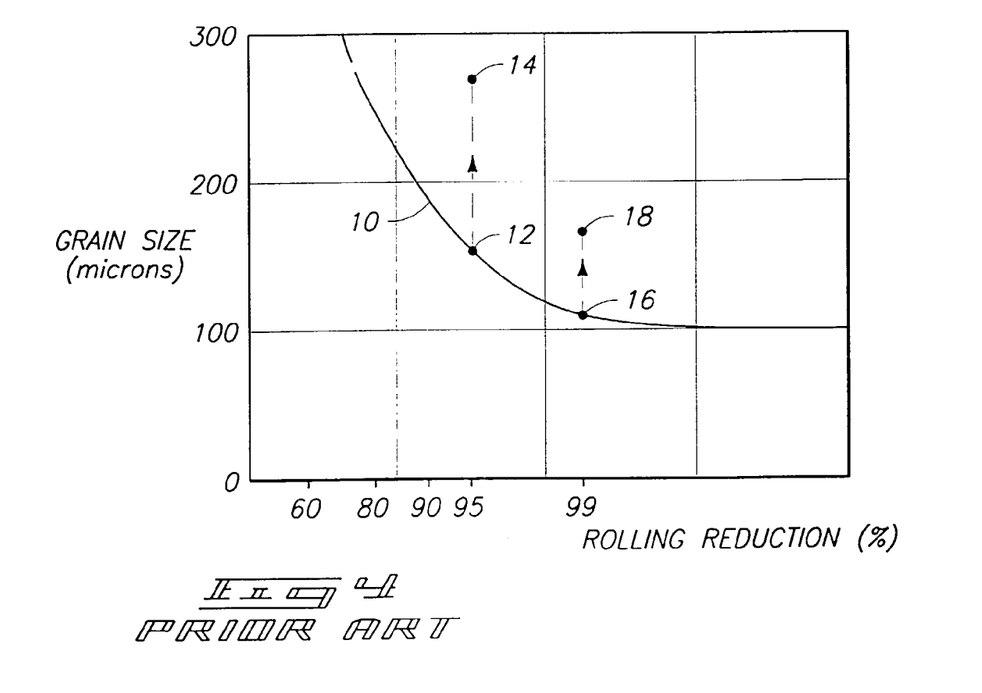
FIG. 4 is a graph illustrating an effect of prior art rolling reduction processes on grain size of 99.9995% aluminum which is self-recrystallized at room temperature.

FIG. 4 summarizes results obtained for a prior art high purity aluminum material. Specifically, FIG. 4 shows a curve 10 comprising a relationship between a percentage of rolling reduction and grain size (in microns). A solid part of curve 10 shows an effect of rolling reduction on a 99.9995% aluminum material which is self-recrystallized at room temperature. As can be seen, even a high rolling reduction of 95% results in an average grain size of about 160 microns (point 12), which is a relatively coarse and non-uniform structure. Annealing at 150° C. for 1 hour significantly increases the grain size to 270 microns (point 14). An increase of reduction to 99% can reduce the grain size to 110 microns (point 16 of FIG. 4), but heating to 150° C. for 1 hour increases the average grain size to 170 microns (point 18 of FIG. 4).

Figure 6:
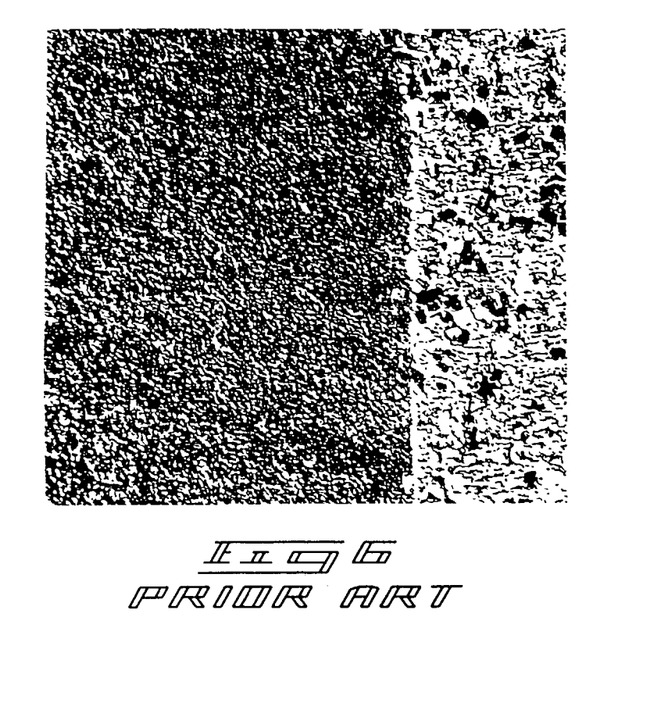
FIG. 6 is an optical micrograph of 99.9995% aluminum plus 30 ppm Si after 90% cold rolling reduction (magnified 50 times).
Figure 7:
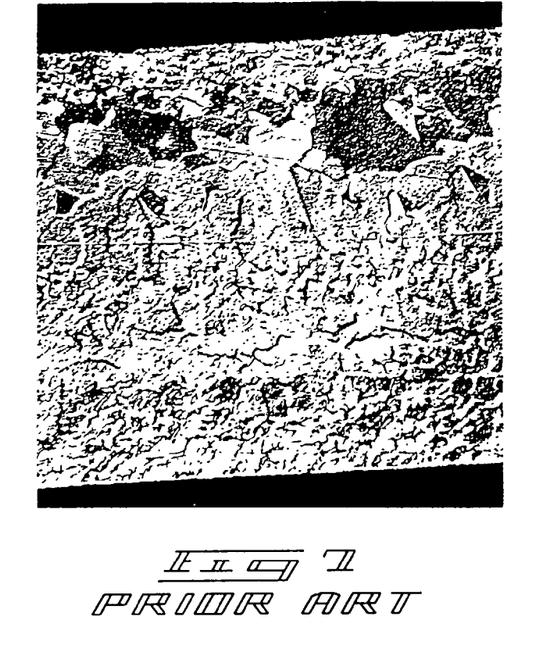
FIG. 7 is an optical micrograph of 99.9995% aluminum plus 30 ppm Si after 90% cold rolling reduction and annealing at 150° C. for 1 hour (magnified 50 times).

Attempts have been made to stabilize recrystallized high purity aluminum structures by adding low amounts of different doping elements (such as silicon, titanium and scandium) to the materials. A difficulty that occurs when the doping elements are incorporated is that full self-recrystallization can generally not be obtained for an entirety of the material, and instead partial recrystallization is observed along grain boundaries and triple joints. For example, the structure of a material comprising 99.9995% aluminum with 30 ppm Si doping is only partly recrystallized after rolling with a high reduction of 95% (see FIG. 6) in contrast to the fully recrystallized structure formed after similar rolling of a pure material (see FIG. 2). Accordingly, additional annealing of the rolled material at a temperature of 150° C. for about 1 hour is typically desired to obtain a fully recrystallized doped structure. Such results in coarse and non-uniform grains (see FIG. 7).

Figure 5:
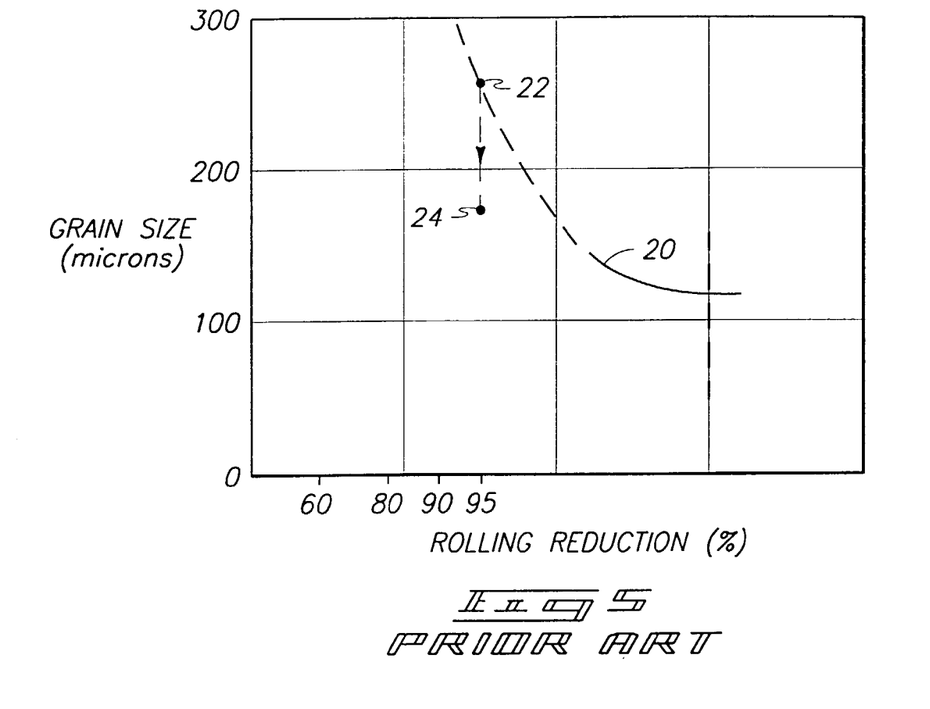
FIG. 5 is a graph illustrating the effect of prior art rolling reduction on grain size of a material comprising 99.9995% aluminum with 30 ppm Si, with such material being partly self-recrystallized at room temperature.

FIG. 5 illustrates data obtained for 99.9995% aluminum with a 30 ppm silicon dopant. The curve 20 of FIG. 5 conforms to experimental data of 99.9995% aluminum with 30 ppm silicon after rolling with different reductions. A dashed part of the curve 20 corresponds to partial self-recrystallization after rolling, while a solid part of the curve corresponds to full self-recrystallization. The full self-recrystallization is attained after intensive reductions of more than 97%, which are practically not available in commercial target fabrication processes. The point 22 shows the average grain size achieved for the as-deformed material as being about 250 microns, and the point 24 shows that the grain size reduces to about 180 microns after the material is annealed at 150° C. for 1 hour. The points 22 and 24 of FIG. 5 correspond to the structures of FIGS. 6 and 7.

For the reasons discussed above, conventional metal-treatment procedures are incapable of developing the fine grain size and stable microstructures desired in high purity aluminum target materials for utilization in flat panel display technologies. For instance, a difficulty exists in that conventional deformation techniques are not generally capable of forming thermally stable grain sizes of less than 150 microns for both doped and non-doped conditions of high purity metals. Also, particular processing environments can create further problems associated with conventional metal-treatment processes. Specifically, there is a motivation to use cold deformation as much as possible to refine structure, which can remove advantages of hot processing of cast materials for healing pores and voids, and for eliminating other casting defects. Such defects are difficult, if not impossible, to remove by cold deformation, and some of them can even be enlarged during cold deformation. Accordingly, it would be desirable to develop methodologies in which casting defects can be removed, and yet which achieve desired small grain sizes and stable microstructures.

SUMMARY OF THE INVENTION

In one aspect, the invention includes a method of forming an aluminum-comprising physical vapor deposition target. An aluminum-comprising mass is deformed by equal channel angular extrusion, with the mass being at least 99.99% aluminum and further comprising less than or equal to about 1,000 ppm of one or more dopant materials comprising elements selected from the group consisting of Ac, Ag, As, B, Ba, Be, Bi, C, Ca, Cd, Ce, Co, Cr, Cu, Dy, Er, Eu, Fe, Ga, Gd, Ge, Hf, Ho, In, Ir, La, Lu, Mg, Mn, Mo, N, Nb, Nd, Ni, O, Os, P, Pb, Pd, Pm, Po, Pr, Pt, Pu, Ra, Rf, Rh, Ru, S, Sb, Sc, Se, Si, Sm, Sn, Sr, Ta, Tb, Te, Ti, Tl, Tm, V, W, Y, Yb, Zn and Zr. After the aluminum-comprising mass is deformed, the mass is shaped into at least a portion of a sputtering target. The sputtering target can ultimately be formed to be either a monolithic or mosaic sputtering target.

In another aspect, the invention encompasses a method of forming an aluminum-comprising physical vapor deposition target which is suitable for sputtering aluminum-comprising material to form an LCD device. An aluminum-comprising mass is deformed by equal channel angular extrusion. After the mass is deformed, it is shaped into at least a portion of a physical vapor deposition target. The physical vapor deposition target has an average grain size of less than or equal to 45 microns.

In yet another aspect, the invention encompasses a physical vapor deposition target consisting essentially of aluminum and less than or equal to 1,000 ppm of one or more dopant materials comprising elements selected from the group consisting of Ac, Ag, As, B, Ba, Be, Bi, C, Ca, Cd, Ce, Co, Cr, Cu, Dy, Er, Eu, Fe, Ga, Gd, Ge, Hf, Ho, In, Ir, La, Lu, Mg, Mn, Mo, N, Nb, Nd, Ni, O, Os, P, Pb, Pd, Pm, Po, Pr, Pt, Pu, Ra, Rf, Rh, Ru, S, Sb, Sc, Se, Si, Sm, Sn, Sr, Ta, Tb, Te, Ti, Tl, Tm, V, W, Y, Yb, Zn and Zr. The physical vapor deposition target has an average grain size of less than or equal to 100 microns.

BRIEF DESCRIPTION OF THE DRAWINGS

Preferred embodiments of the invention are described below with reference to the following accompanying drawings.

FIGS. 15A and 15B show optical micrographs of a material comprising aluminum and 10 ppm Sc after 6 ECAE passes via route D (i.e., a route corresponding to billet rotation of 90° into a same direction after each pass through an ECAE device).

DETAILED DESCRIPTION OF THE PREFERRED EMBODIMENTS

A deformation technique known as equal channel angular extrusion (ECAE) is used with advantage for the manufacture of physical vapor deposition targets, and in particular aspects of the invention is utilized for the first time in the manufacture of FPD and LCD targets. The ECAE technique was developed by V. M. Segal, and is described in U.S. Pat. Nos. 5,400,633; 5,513,512; 5,600,989; and 5,590,390. The disclosure of the aforementioned patents is expressly incorporated herein by reference.

The general principle of ECAE is to utilize two intersecting channels of approximately identical cross-section and extrude a billet through the channels to induce deformations within the billet. The intersecting channels are preferably exactly identical in cross-section to the extent that "exactly identical" can be measured and fabricated into an ECAE apparatus. However, the term "approximately identical" is utilized herein to indicate that the cross-sections may be close to exactly identical, instead of exactly identical, due to, for example, limitations in fabrication technology utilized to form the intersecting channels.

An ECAE apparatus induces plastic deformation in a material passed through the apparatus. Plastic deformation is realized by simple shear, layer after layer, in a thin zone at a crossing plane of the intersecting channels of the apparatus. A useful feature of ECAE is that the billet shape and dimensions remain substantially unchanged during processing (with term "substantially unchanged" indicating that the dimensions remain unchanged to the extent that the intersecting channels have exactly identical cross-sections, and further indicating that the channels may not have exactly identical cross-sections).

The ECAE technique can have numerous advantages. Such advantages can include: strictly uniform and homogeneous straining; high deformation per pass; high accumulated strains achieved with multiple passes; different deformation routes, (i.e., changing of billet orientation at each pass of multiple passes can enable creation of various textures and microstructures); and low load and pressure.

ECAE can enable a decrease in the grain size of high purity aluminum and aluminum alloys used for the manufacture of LCDs by at least a factor of three compared to conventional practices.

Various aspects of the present invention are significantly different from previous ECAE applications. Among the differences is that the present invention encompasses utilization of ECAE to deform high purity materials (such as, for example, aluminum having a purity of greater than 99.9995% as desired for FPD targets), in contrast to the metals and alloys that have previously been treated by ECAE. High purity metals are typically not heat treatable, and ordinary processing steps like homogenizing, solutionizing and aging can be difficult, if not impossible, to satisfactorily apply with high purity metals. Further, the addition of low concentrations of dopants (i.e., the addition of less than 100 ppm of dopants) doesn't eliminate the difficulties encountered in working with high purity metals. However, the present invention recognizes that a method for controlling structure of single-phase high purity materials is a thermo-mechanical treatment by deformation, annealing and recrystallization. Also, as high purity metals are generally not stable and cannot be refined by dynamic recrystallization in the same manner as alloys, the present invention recognizes that static recrystallization can be a more appropriate methodology for annealing of high purity metals than dynamic recrystallization. When utilizing static recrystallization annealing of materials, it is preferred that the static recrystallization be conducted at the lowest temperature which will provide a fine grain size. If strain is increased to a high level within a material, such can reduce a static recrystallization temperature, with high strains leading to materials which can be statically recrystallized at room temperature. Thus, self-recrystallization of the materials can occur immediately after a cold working process. Such can be an optimal mechanism for inducing desired grain sizes, textures, and other microstructures within high purity metal physical vapor deposition target structures.

In one aspect, the present invention utilizes ECAE to form a physical vapor deposition target for LCD applications. The target comprises a body of aluminum with a purity greater than or equal to 99.99% (4N). The aluminum can be doped with less than or equal to about 1000 ppm of dopant materials. The dopant materials are not considered impurities relative to the doped aluminum, and accordingly the dopant concentrations are not considered in determining the purity of the aluminum. In other words, the percent purity of the aluminum does not factor in any dopant concentrations.

An exemplary target can comprise a body of aluminum having a purity greater than or equal to 99.9995%. A total amount of dopant material within the aluminum is typically between 5 ppm and 1,000 ppm, and more preferably between 10 ppm and 100 ppm. The amount of doping should be at least the minimal amount assuring the stability of material microstructures during sputtering, and less than the minimum amount hindering the completion of full dynamic recrystallization during equal channel angular extrusion.

The dopant materials can, for example, comprise one or more elements selected from the group consisting of Ge, Group IIA elements, Group IIIA elements, Group VIA elements, Group VA elements, Group VIB elements, Group IVB elements, Group VIB elements, Group VIII elements, and Rare Earth elements. Alternatively, the dopant materials can comprise one or more of Ac, Ag, As, B, Ba, Be, Bi, C, Ca, Cd, Ce, Co, Cr, Cu, Dy, Er, Eu, Fe, Ga, Gd, Ge, Hf, Ho, In, Ir, La, Lu, Mg, Mn, Mo, N, Nb, Nd, Ni, O, Os, P, Pb, Pd, Pm, Po, Pr, Pt, Pu, Ra, Rf, Rh, Ru, S, Sb, Sc, Se, Si, Sm, Sn, Sr, Ta, Tb, Te, Ti, Ti, Tm, V, W, Y, Yb, Zn and Zr.

The elements of the dopant materials can be in either elemental or compound form within the materials. The dopant materials can be considered to comprise two different groups of materials. The first group comprises dopant materials having effectively no room temperature solid solubility relative to an aluminum matrix, and having no intermediate compounds. Such first type of dopant materials are Be, Ge and Si. The second type of dopant materials have effectively no room temperature solid solubility in aluminum, and are not toxic, refractory or precious metals, and further possess relatively high melting temperatures. The second type of materials include various elements selected from the Group IIA elements; the Group IIIB elements; the Group IVB elements; the Group VIB elements; the Group VIII elements; the Group IIIA elements; the Group VA elements; the Group VIA elements, and the Rare Earth elements (i.e., the lanthanides).

The dopant materials can be in the form of precipitates or solid solutions within the aluminum-material matrix. Preferably, the target is composed of aluminum with purity greater than or equal to 99.99% (4N), and with one or more dopant materials comprising elements selected from the group consisting of Si, Sc, Ti, and Hf.

The present invention can provide a physical vapor deposition target for LCD applications comprising a body of aluminum with purity greater than or equal to 99.99% (4N), alone or doped with less than 1000 ppm of dissimilar elements selected from a group consisting of one or more of Ac, Ag, As, B, Ba, Be, Bi, C, Ca, Cd, Ce, Co, Cr, Cu, Dy, Er, Eu, Fe, Ga, Gd, Ge, Hf, Ho, In, Ir, La, Lu, Mg, Mn, Mo, N, Nb, Nd, Ni, O, Os, P, Pb, Pd, Pm, Po, Pr, Pt, Pu, Ra, Rf, Rh, Ru, S, Sb, Sc, Se, Si, Sm, Sn, Sr, Ta, Tb, Te, Ti, Tl, Tm, V, W, Y, Yb, Zn and Zr. Further the target can consist of aluminum and one or more of the listed dissimilar elements, or can consist essentially of aluminum and the one or more of the listed dissimilar elements.

The LCD target can be made of a body of Al with purity greater than 99.99% (4N), alone or doped with less 100 ppm of one or more dissimilar elements listed above, and the total doping content of any element listed above can be higher than the solubility limit of this element at the temperature at which ECAE is performed.

Particularly preferred materials for LCD targets consist of Al and less than 100 ppm of Si; Al and less than 100 ppm of Sc; Al and less than 100 ppm of Ti; or Al and less than 100 ppm of Hf.

A preferred LCD target possesses: a substantially homogeneous composition throughout; a substantial absence of pores, voids, inclusions and any other casting defects; a predominate and controlled grain size of less than about 50 micrometers; and a substantially uniform structure and controlled texture throughout. Very fine and uniform precipitates with average grain diameters of less than 0.5 micrometers can also be present in a preferred target microstructure.

LCD physical vapor deposition targets of the present invention can be formed from a cast ingot comprising, consisting of, or consisting essentially of aluminum. The aluminum material can be extruded through a die possessing two contiguous channels of equal cross section intersecting each other at a certain angle. The ingot material can also be subjected to annealing and/or processing with conventional target-forming processes such as rolling, cross-rolling or forging, and ultimately fabricated into a physical vapor deposition target shape. The extrusion step can be repeated several times via different deformation routes before final annealing, conventional processing and fabrication steps to produce very fine and uniform grain sizes within a processed material, as well as to control texture strength and orientation within the material.

Processes of the present invention can be applied to large flat panel display monolithic targets, or targets comprised of two or more segments.

Figure 8:
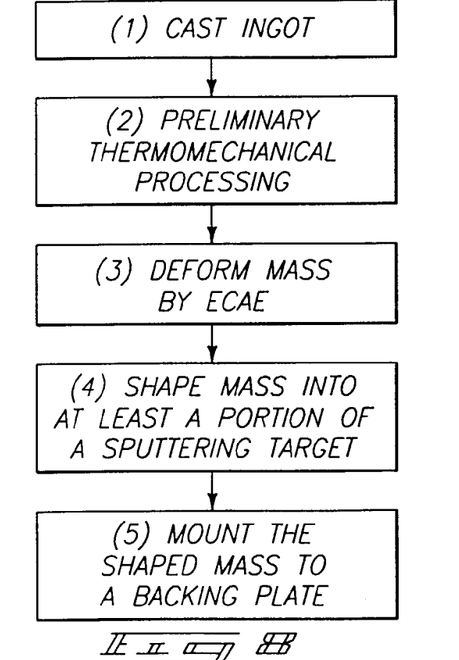
FIG. 8 shows a flow chart diagram of a method encompassed by the present invention.

Particular embodiments of the present invention pertain to formation of aluminum-comprising physical vapor deposition targets, such as, for example, formation of aluminum-comprising physical vapor deposition targets suitable for liquid crystal display (LCD) applications. FIG. 8 shows a flow-chart diagram of an exemplary process of the present invention. In a first step, an aluminum-comprising cast ingot is formed, and in a second step the ingot is subjected to thermo-mechanical processing. The material resulting from the thermo-mechanical processing is an aluminum-comprising mass. The mass is subsequently deformed by equal channel angular extrusion (ECAE). Such deformation can be accomplished by one or more passes through an ECAE apparatus. Exemplary ECAE apparatuses are described in U.S. Pat. Nos. 5,400,633; 5,513,512; 5,600,989; and 5,590,390. The aluminum-comprising mass can consist of aluminum, or can consist essentially of aluminum. The mass preferably comprises at least 99.99% aluminum. The mass can further comprise less than or equal to about 100 parts per million (ppm) of one or more dopant materials comprising elements selected from the group consisting of Ac, Ag, As, B, Ba, Be, Bi, C, Ca, Cd, Ce, Co, Cr, Cu, Dy, Er, Eu, Fe, Ga, Gd, Ge, Hf, Ho, In, Ir, La, Lu, Mg, Mn, Mo, N, Nb, Nd, Ni, O, Os, P, Pb, Pd, Pm, Po, Pr, Pt, Pu, Ra,Rf, Rh, Ru, S, Sb, Sc, Se, Si, Sm, Sn, Sr, Ta, Tb, Te, Ti, Tl, Tm, V, W, Y, Yb, Zn and Zr. The aluminum-comprising mass can consist of aluminum with less than or equal to about 100 ppm of one or more of the dopant materials described above, or consist essentially of aluminum with less than or equal to about 100 ppm of one or more of the dopant materials described above.

ECAE is utilized in methodology of the present invention for addressing problems found during formation of PVD targets of high-purity materials. ECAE is a process which utilizes a simple shear deformation mode, which is different from a dominant deformation mode achieved by uniaxial compression of forging or rolling. In high purity metals, the intensive simple shear of ECAE can manifest itself by developing very thin and long shear bands. The strains achieved inside these bands can be many times larger than the strains achieved outside the bands. The shear bands occur along a crossing plane of the channels utilized during ECAE. If a processing speed is sufficiently low to eliminate adiabatic heating and flow localization at the macro-scale, shear bands in pure metals can have a thickness of only a few microns with a near regular spacing between each other of a few tenths of a micron. The bands can be observed after a single ECAE pass. However, if the number of ECAE passes increases the spacing between shear bands can reduce to a stable size. The actual size can vary depending on the material being subjected to ECAE, and the purity of such material. A strain inside of the shear bands can be equivalent to very high reductions (specifically, reductions of about 99.99% or more), and static recrystallization is immediately developed in the bands. The static recrystallization can lead to new fine grains growing in spacing between the bands.

Figure 9:
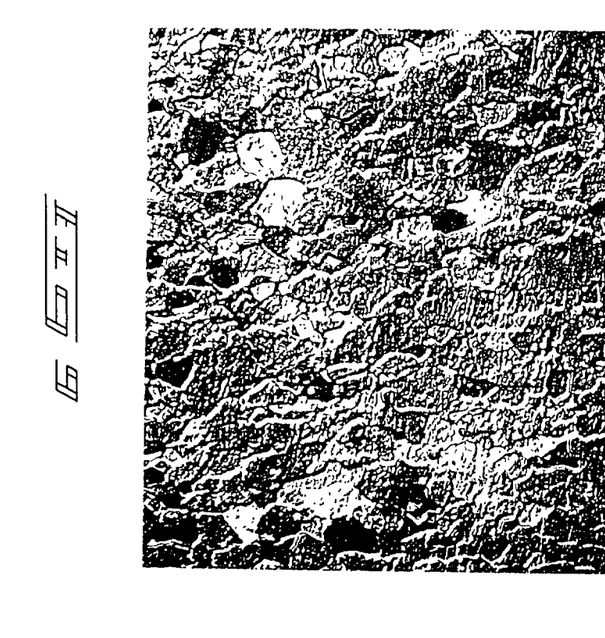
FIG. 9 is an optical micrograph showing the structure of 99.9995% aluminum after 2 passes through an equal channel angular extrusion (ECAE) device (magnified 50 times).
Figure 10:
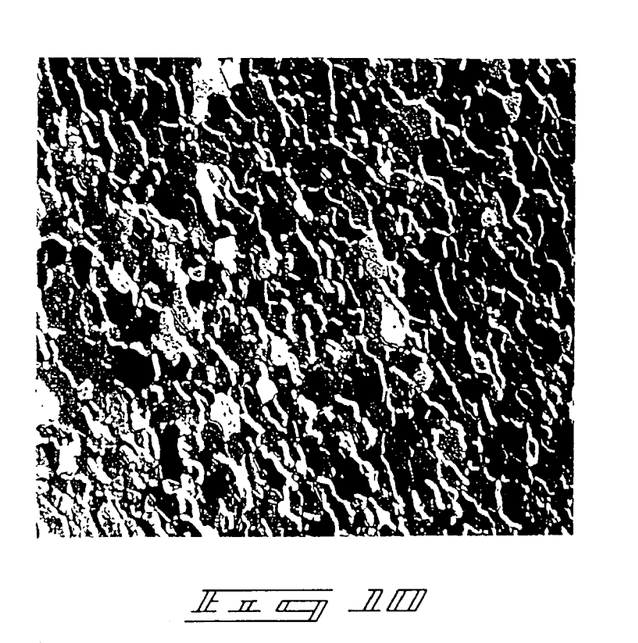
FIG. 10 is an optical micrograph of 99.9995% aluminum after 6 passes through an ECAE device (magnified 50 times).

FIGS. 9 and 10 show fully recrystallized structures of 99.9995% aluminum after ECAE with 2 passes and 6 passes, respectively. The grains within the material attained a stable size after 6 passes. Experiments have shown that processing with a route corresponding to billet rotation of 90° into a same direction after each pass can provide the most uniform and equiaxial recrystallized structures for high purity materials. Such route is defined as route "D" in accordance with the standard definitions that have been utilized to described ECAE processing in previous publications.

Figure 11:
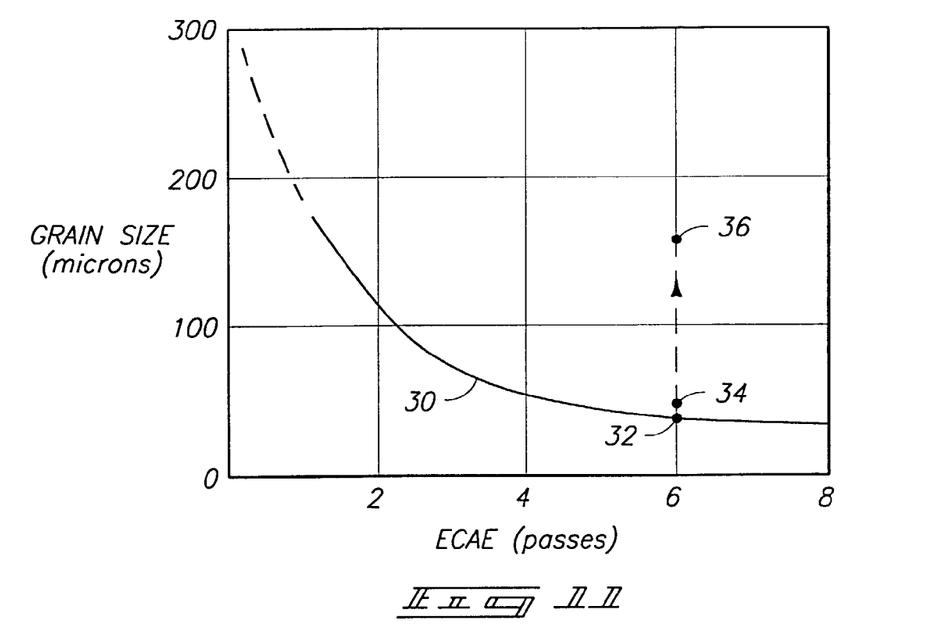
FIG. 11 is a graph illustrating the effect of ECAE on grain size of 99.9995% aluminum which is self-recrystallized at room temperature.

FIG. 11 shows a curve 30 demonstrating the change manifested in grain size of a high-purity aluminum material subjected to varying numbers of ECAE passes. Curve 30 of FIG. 11 can be compared with the curve 10 of FIG. 4 to illustrate advantages in grain size reductions attained by an ECAE process relative to the conventional processes utilized to generate the curve 10 of FIG. 4.

The ECAE structures are found to not only have small grain sizes, but also to be stable during additional annealing to sputtering-type temperatures. For example, after annealing at 150° C. for 1 hour, a material subjected to six ECAE passes shows only a relatively insignificant increase in grain size of from 40 microns (point 32 in FIG. 11) to 50 microns (point 34 in FIG. 11). However, the structures diagrammed at FIG. 11 were found to be relatively unstable when subjected to rolling procedures, even when the rolling procedures accomplished only moderate reductions. For instance, a significant increase of grain size from 40 microns after 6 ECAE passes to 160 microns occurred after rolling with the reduction of 75% (point 36 on FIG. 11).

Generally, ECAE can be effectively performed only when a ratio of billet size to thickness is from about 4 to 8, while flat panel display targets typically have a ratio of up to 100 or more. Accordingly, additional rolling of ECAE processed billets may be desired to fabricate the thin targets desired for FPD. Thus, it would be desirable to develop methodologies which avoided the structure coarsening evidenced by point 36 of FIG. 11. One way to avoid such structure coarsening is to eliminate rolling. This can be achieved if an ECAE processed billet has a sufficiently large size to fabricate FPD targets by splitting the billet thickness for a number of thin plates. However, this can be a complicated process since FPD targets have a typical size of 1000 millimeters, or larger; and ECAE of such large billets is typically not practical. Another method for incorporating ECAE processed billets into FPD targets is to fabricate mosaic targets by using a large number of small pieces cut from ECAE billets (see, for example, FIGS. 16 and 17). However, mosaic targets are typically expensive to fabricate, and also typically do not provide good performance in sputtering applications.

Another method which can be utilized to avoid grain size growth within ECAE processed materials is to provide doping elements within the ECAE materials. However, while the addition of dopants can typically be utilized for structure refinement when static recrystallization is performed as a separate annealing operation at sufficiently high temperatures after mechanical working, it cannot generally be applied in the case of self-annealing at room temperature during or immediately after deformation performed by forging or rolling because the doping can make even heavily deformed structures more stable.

Figure 12:
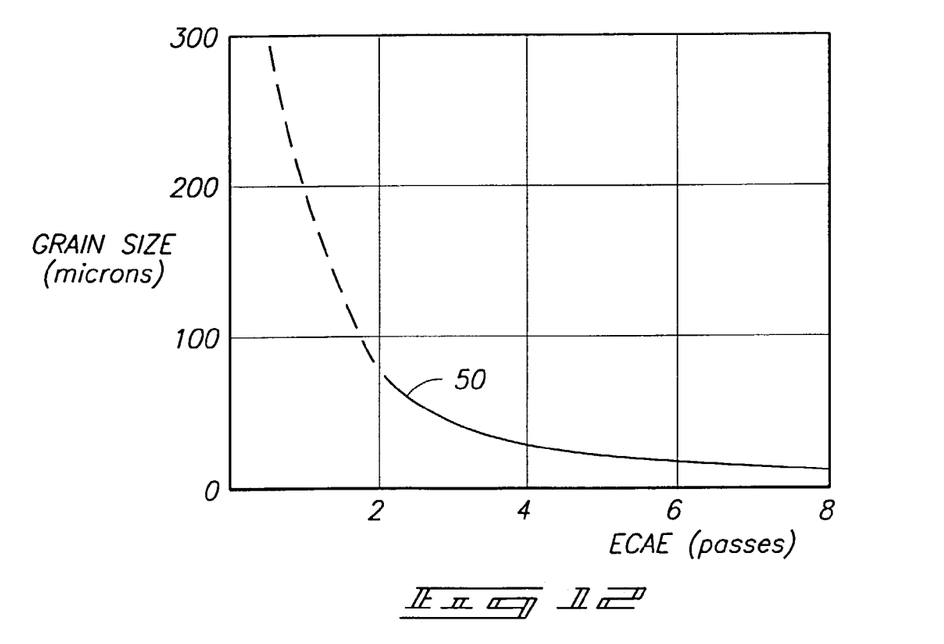
FIG. 12 is a graph illustrating the effect of ECAE passes on grain size of a material comprising 99.9995% aluminum and 30 ppm Si. The graph illustrates the grain size after self-recrystallization of the material at room temperature.

ECAE can be utilized for grain refinement of high purity metals, even if the metals have some dopant material therein. For instance, 99.9995% aluminum having 30 ppm of silicon therein is found to be almost fully recrystallized after 2 passes through an ECAE apparatus. If the material is subjected to 3 to 6 passes through the apparatus, it is found to have a fine and uniform structure, with such structure remaining substantially unchanged after 6 passes through the device. FIG. 12 illustrates a curve 50 corresponding to the change in grain size of 99.9995% aluminum having 30 ppm silicon therein, with various numbers of ECAE passes. A dashed part of curve 50 corresponds to partial recrystallization, and a solid part of curve 50 corresponds to full recrystallization at room temperature immediately after ECAE.

Figure 13:
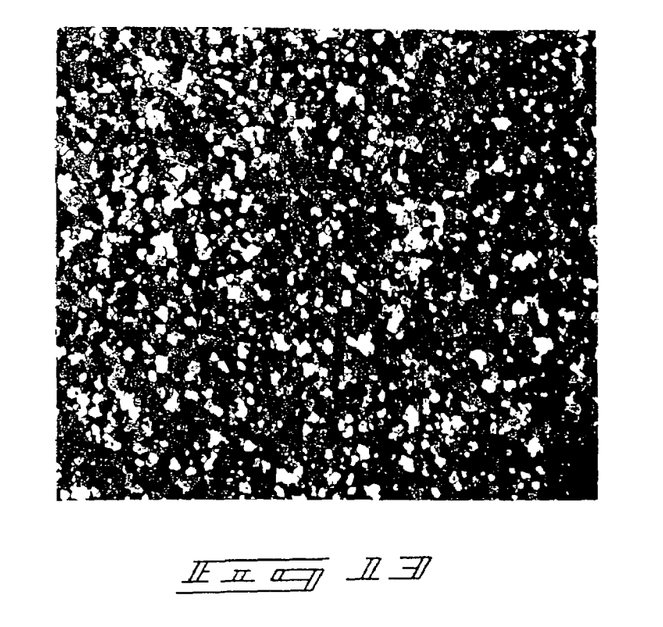
FIG. 13 is an optical micrograph showing the structure of a material comprising 99.9995% aluminum and 30 ppm Si after 6 passes through an ECAE device (magnified 100 times).
Figure 14:
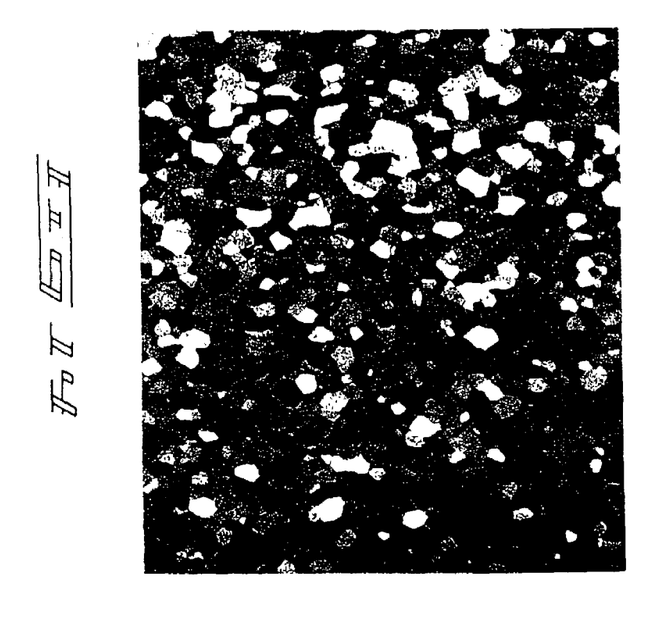
FIG. 14 is an optical micrograph showing the structure of a material comprising 99.9995% aluminum and 30 ppm Si after 6 passes through an ECAE device, 85% cold rolling reduction, and annealing at 150° C. for 16 hours (magnified 100 times).

The structure after 6 passes is illustrated in FIG. 13. Such structure is a substantially perfectly recrystallized, uniform, very fine and equiaxial structure having an average grain size of about 15 microns. Such properties can provide exceptional stability of the structure during subsequent rolling and annealing. For instance, subsequent rolling with a reduction of up to 90%, and long-term annealing of about 16 hours at a temperature of 150° C. causes only a moderate grain growth, with the resulting structure having an average grain size of about 30 microns. Further, structure uniformity is maintained, as illustrated in the optical micrograph of FIG. 14. Such stability of the small grain size microstructures achieved with ECAE is substantially different than what can be accomplished with conventional processes of forging, rolling or other deformation techniques. Accordingly, ECAE can provide improved methodology for fabricating high purity targets with fine and stable microstructures for physical vapor deposition applications. It is found that ECAE processing utilizing from 3 to 6 passes through an ECAE device is typically suitable for forming a physical vapor deposition target blank. In particular, ECAE with 4 passes of route "D" (i.e., rotation of 90° into the same direction after each pass) can be an optimal processing schedule.

Experiments have been performed on doping selection and concentration. Specifically, the doping elements Si, Sc and Ti have been tested. Concentrations ranged from 5 ppm to 100 ppm for each of the elements. In all of the tested cases, the effects achieved with the elements were found to be qualitatively about the same, with some quantitative differences. For instance, it was found that silicon doping can provide the best refinement, provided that a doping concentration is from about 5 ppm to about 100 ppm.

Among the benefits of utilizing ECAE for forming target blanks of high-purity materials, relative to utilizing conventional processes, is that ECAE can be utilized in combination with a hot-forging operation. Specifically, ECAE removes restrictions on attainable deformation during processing from a cast ingot to a target blank, and accordingly removes requirements on the original structures subjected to ECAE. A material can be subjected to hot forging prior to ECAE. Such hot forging can result in substantially entire elimination of casting defects, which can further result in improved performance of targets formed by methodology of the present invention relative to targets formed by conventional processes.

In a fourth step of the FIG. 8 flow-chart diagram, the deformed aluminum-comprising mass is shaped into a PVD target, or at least a portion of a target. Such shaping can comprise, for example, one or more of rolling, cross-rolling, forging, and cutting of the aluminum-comprising mass. The mass can be formed into a shape comprising an entirety of a physical vapor deposition target, or alternatively can be formed into a shape comprising only a portion of a physical vapor deposition target. An exemplary application wherein the mass is formed into a shape comprising only a portion of a physical vapor deposition target is an application in which the mass is utilized to form part of a so-called mosaic target. If the aluminum-comprising mass is utilized in a mosaic target, and further utilized for LCD applications, it can be desired that all of the various target portions of the mosaic target be aluminum-comprising masses which have been deformed by equal channel angular extrusion prior to incorporation into the mosaic target.

In the fifth step of the FIG. 8 process, the shaped mass is mounted to a backing plate to incorporate the mass into a target structure. Suitable backing plates and methodologies for mounting aluminum-comprising targets to backing plates are known in the art. It is noted that the invention encompasses embodiments wherein an aluminum-comprising mass is utilized directly as a physical vapor deposition target without being first mounted to a backing plate, as well as embodiments in which the mass is mounted to a backing plate.

Processes of the present invention can be utilized to fabricate aluminum-comprising masses into targets having very fine and homogenous grain structures, with predominate sizes of the grains being less than about 50 micrometers. Such targets can be particularly suitable for sputtering applications in forming LCD materials. The present invention recognizes that improvements in grain refinement can be provided by ECAE technology relative to processing of aluminum-comprising materials. The ECAE is preferably conducted at a temperature and speed sufficient to achieve desired microstructures and provide a uniform stress-strain state throughout a processed billet.

The number of passes through an ECAE device, and the particular ECAE deformation route selected for travel through the device can be chosen to optimize target microstructures. For instance, grain refinement can be a consequence of radical structural transformations occurring during intense straining by simple shear through an ECAE device.

Figure 15A:
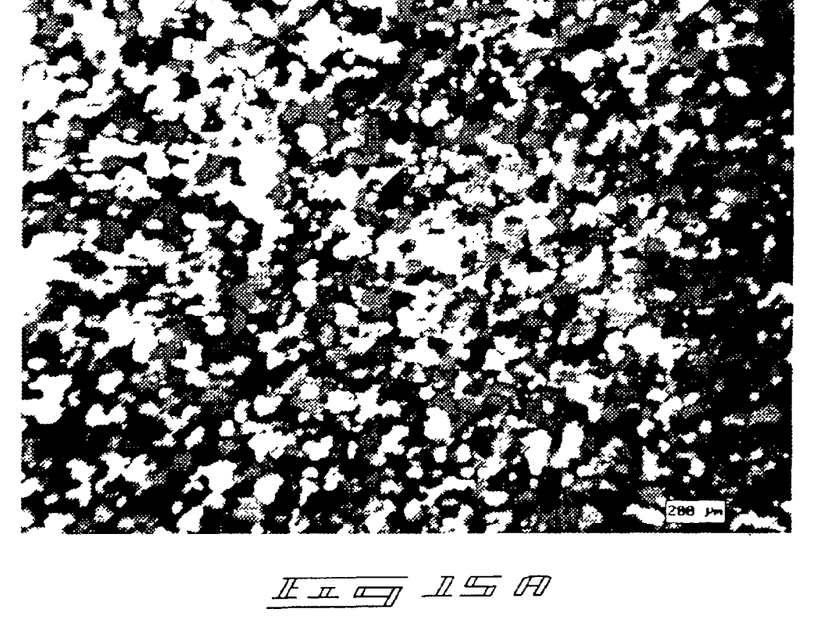
FIG. 15A shows the material in the as-deformed state and FIG. 15B shows material after 85% rolling reduction in thickness.

FIG. 15A illustrates grains obtained for aluminum+10 ppm Sc after ECAE processing. The grains shown in FIG. 15A have an average size of about 20 microns, and are relatively fine, equiaxial, and homogenous. The structure shown in FIG. 15A has an average grain size that is at least a factor of 3 smaller than the sizes produced by conventional target-forming methods.

At least three different aspects of ECAE contribute to the remarkable reduction of grain size and improvement of grain uniformity achieved by treating aluminum-comprising masses in accordance with the present invention. These three aspects are an amount of plastic deformation imparted by ECAE, the ECAE deformation route, and simple shear forces occurring during ECAE.

Figure 15B:
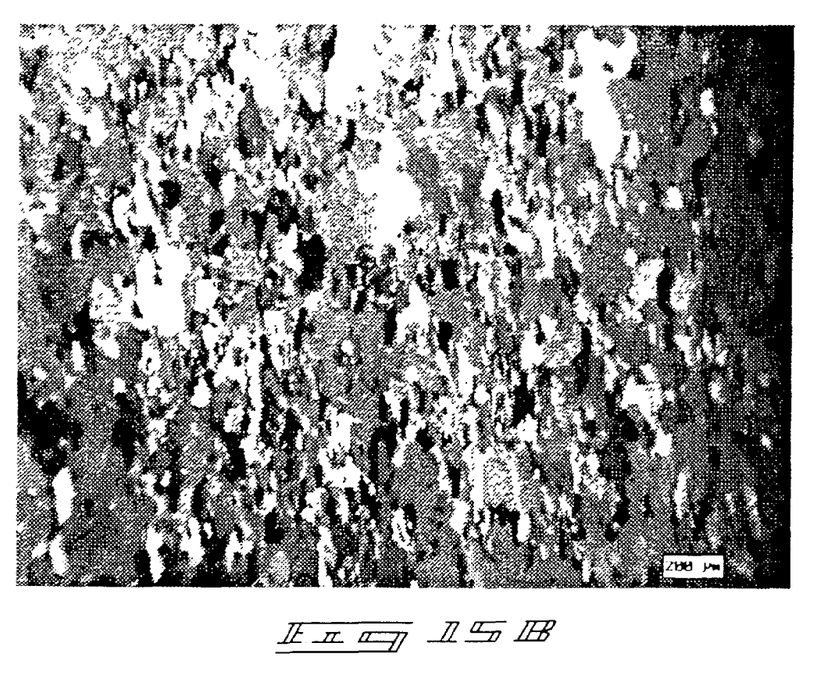

After a material has been subjected to ECAE in accordance with methods of the present invention, the material can be shaped by conventional methods of forging, cross-rolling and rolling to form the material into a suitable shape to be utilized as a target in a sputtering process. The ultrafine grain sizes created during ECAE are found to remain stable and uniform, and to show limited grain growth upon further conventional processing; even during processing comprising a high reduction in thickness of a material. Such is exemplified by FIG. 15, which compares various microstructures of as-deformed ECAE samples (FIG. 15A) to those submitted to further unidirectional rolling at an 85% thickness reduction (FIG. 15B) for aluminum+10 ppm Sc.

Preferably, traditional forming operations utilized for shaping a material after ECAE processing are conducted at temperatures which are less than those which will occur during sputtering. For instance, if sputtering processes are anticipated to occur at about 150° C., then conventional processing of, for example, rolling, cross-rolling, or forging occurring after ECAE will preferably occur at temperatures below 150° C. By conducting such processing at temperatures below the sputtering temperature, the likelihood of the conventional processing increasing grain sizes beyond those desired in a physical vapor deposition target is reduced. Typically, target shaping steps occur at temperatures of less than or equal to about 200° C., and more preferably occur at temperatures less than or equal to about 150° C., to keep the target shaping steps at temperatures below an ultimate sputtering temperature of a target.

The microstructures created during ECAE are found to exhibit exceptional stability upon annealing relative to microstructures created by conventional processes. For example, it is found that a sample of aluminum+30 ppm Si which has been subjected to ECAE shows a limited and progressive increase in average grain size from approximately 12 microns to about 30 microns after annealing at 150° C. for 1 hour. Such average grain size does not significantly change after annealing at 150° C. for 16 hours. In contrast, samples submitted solely to rolling to an 85% reduction in thickness (a conventional process), show a dramatic grain growth up to average grain sizes larger than 250 micron after annealing at only 125° C. for 1 hour.

Utilization of ECAE for processing aluminum targets can enable control of a texture within the targets, with the term "texture" referring to a crystallographic orientation within the target. If a large number (i.e. a vast majority) of the grains in a material have the same crystallographic orientation as one another, the material is referred to as having strong texture. In contrast, if the grains do not have the same crystallographic orientation, the material is referred to as having a weak texture. Note that the referred-to crystallographic orientation is not to imply that the grains are part of a single crystal. Various textures can be created utilizing methodology of the present invention.

Figure 16:
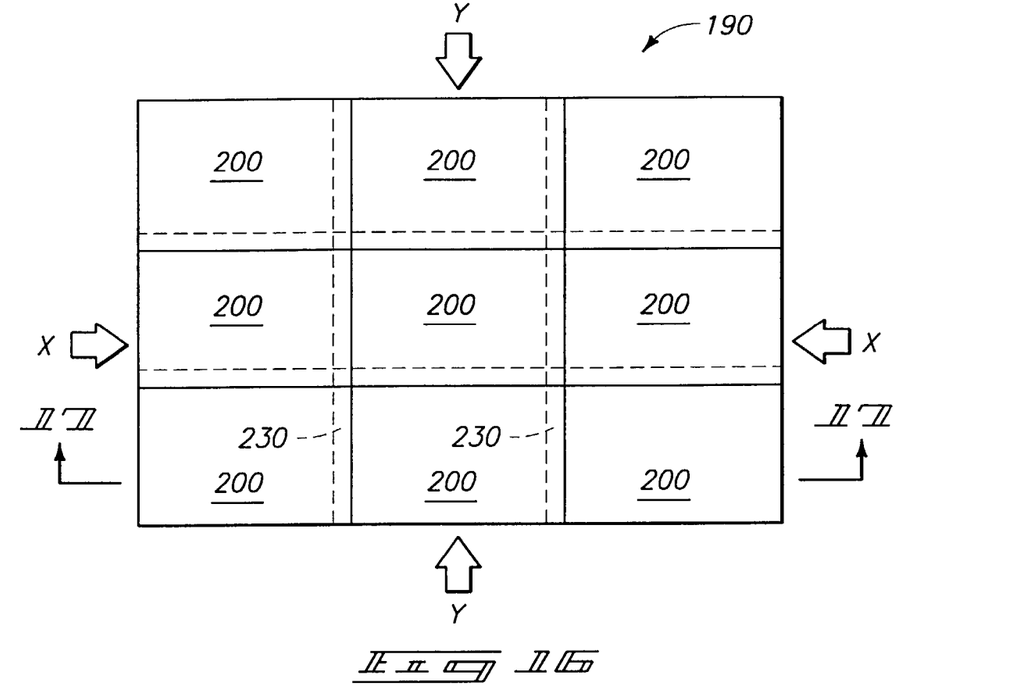
FIG. 16 is a diagrammatic top-view of a tiled target assembly composed of nine billets.
Figure 17:
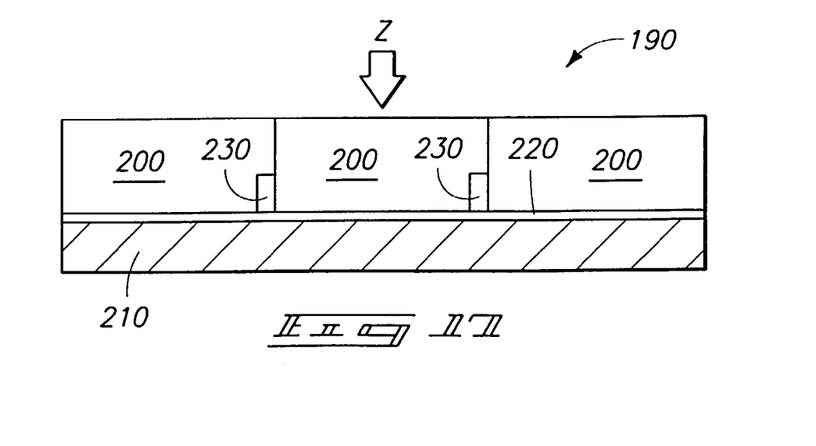
FIG. 17 is a diagrammatic cross-sectional side-view of the target assembly of FIG. 16 shown along the line 17—17.

A particular application of the invention is directed to the manufacture of targets of especially large size. FIGS. 16 and 17 display this aspect of the invention. In FIGS. 16 and 17, the construction of a target 190 in the form of a tiled assembly is provided. Such comprises joining two or more billets 200 of identical shape, dimensions and processing history to a backing plate 210, machining the surface of the resulting assembly, and fabricating the final target 190. Preferably, the backing plate is made of a high strength material and possesses a length and width close to those of the final target. Joining is realized by known methods such as soldering, brazing, welding or diffusion bonding at an interface 220 between the backing plate and the bottom of each single billet and at sufficient time, pressure and temperature. Preferably, techniques such as brazing or soldering will be used because they can utilize lower temperatures than some of the other methods. Also, lateral forces along the three different directions X, Y and Z shown in FIGS. 16 and 17 are exerted with appropriate tooling. The forces along the directions X and Y keep all the billets held tightly together, while the force along the Z direction participates to the joining operations and keeps the surface of the final target flat. Also, as shown in FIGS. 16 and 17, one side of the bottom of each billet is preferably machined to leave a space 230 at the bottom between adjacent billets. Such space can have materials provided therein which are used for joining the billets together (the space is shown in dashed-line phantom view in FIG. 16). This space can also prevent the materials utilized for soldering, brazing, welding and diffusion bonding from going between billets and contaminating the target surface and the volume to be sputtered.

The method described with reference to FIGS. 16 and 17 can present several advantages for the production of very large targets. First, current equipment and tooling can be employed. Second, contrary to current known methods, intensive rolling and/or cross-rolling are not used to reach final target size; therefore, for example, as-deformed ECAE billets can be directly joined together and retain their advantages in terms of grain size and texture. Third, the procedure is easily adaptable to any future evolution of the size of LCD targets.

EXAMPLES

Example 1

High-Purity Aluminum Having 30 ppm Si Therein, and Processed in Accordance with Methodology of the Present Invention As-cast material defined as 5N5 Al and 30 ppm Si is processed via hot forging at 75% reduction and ECAE for 6 passes via route D. The material has a fully recrystallized structure with grain size of 15 µm. Subsequent rolling with a reduction of 85% grew the average grain size to 20 µm with an aspect ratio of about 1.5. Annealing at a temperature of 150° C. for 1 hour, which was estimated as the highest temperature expected during a subsequent sputtering process, resulted in an insignificant grain growth to 23 µm. During a long (16 hours) exposure to 150° C., grains grew to 28 µm. Also, a temperature increase to 200° C. for 1 hour yielded a similar grain size of about 30 µm. Therefore, ECAE plus rolling provides a fine and uniform structure for a material of 5N5 Al and 30 ppm Si, with an average grain size of less than or equal to about 30 µm which is stable for sputtering target applications.

Example 2

High-Purity Aluminum Having 10 ppm Silicon Therein, and Processed Accordance with Methodology of the Present Invention Samples were cast, hot forged at 74% reduction and ECAE extruded for 6 passes via route D. A Structure after ECAE is fully dynamically recrystallized with an average grain size of about 19 µm. Subsequent rolling at 85%, and annealing at 150° C. for 1 hour yields a fully recrystallized grain size of around 35 µm.

Example 3

High-Purity Aluminum Having 10 ppm Sc Therein, and Processed in Accordance with Methodology of the Present Invention Samples were cast, hot forged at 74% reduction, and ECAE extruded for 6 passes via route D. A structure after ECAE is fully dynamically recrystallized with an average grain size of about 26 µm. During rolling up to a reduction of 60%, the structure remains stable and typical for heavily-rolled materials. After 70% reduction, first recrystallized grains are observed. At 85% rolling reduction, about 60% of the sample area was fully recrystallized with an average grain size of about 45 µm.

Example 4

Aluminum Having 30 ppm Silicon Therein, and Processed in Accordance with Prior Art Technologies The present example was run to allow comparison of previous results of ECAE (examples 1–3) with data obtained utilizing conventional processing technologies. The same 5N5 Al+30 ppm Si material was used for this example as was used in Example 1. A cast, hot forged at 74% reduction and annealed sample was subsequently cold rolled with a reduction of 85%. Its structure is not fully recrystallized and fine dynamically recrystallized grains can be observed only along boundaries of original grains. Additional annealing at 125° C. for 1 hour provides full recrystallization but the microstructure has a highly non-uniform distribution with an average grain size of about 150 µm. Annealing at higher temperatures further increases the average grain size. The example illustrates that conventional processing techniques only provide a moderate refinement of the structure of 5N5 Al with 30 ppm Si doping. Specifically, the grain size achieved is well above a desired limit of 100 µm, and, in fact, is greater than 150 µm.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming an aluminum-comprising physical vapor deposition target, comprising:
   deforming an aluminum-comprising mass by equal channel angular extrusion, wherein the mass consists essentially at least 99.99% aluminum and less than or equal to about 1000 ppm of one or more dopant materials comprising elements selected from the group consisting of Ac, Ag, As, B, Ba, Be, Bi, C, Ca, Cd, Ce, Co, Cr, Cu, Dy, Er, Eu, Fe, Ga, Gd, Ge, Hf, Ho, In, Ir, La, Lu, Mg, Mn, Mo, N, Nb, Nd, Ni, O, Os, P, Pb, Pd, Pm, Po, Pr, Pt, Pu, Ra, Rf, Rh, Ru, S, Sb, Se, Si, Sm, Sn, Sr, Ta, Tb, Te, Ti, Tl, Tm, V, W, Y, Yb, Zn and Zr; and
   after the deforming, shaping the mass into at least a portion of a physical vapor deposition target.

2. The method of claim 1 wherein the physical vapor deposition target is a monolithic target.

3. The method of claim 1 wherein the one or more dopant materials comprise materials selected from the group consisting of B, Ba, Be, Ca, Ce, Co, Cr, Dy, Er, Eu, Gd, Ge, Hf, Ho, La, Ni, Nd, Pd, Pm, Pr, Sb, Si, Sm, Sr, Tb, Te, Ti, Tm, Y,Yb and Zr.

4. The method of claim 1 wherein the one or more dopant materials comprise materials selected from the group consisting of Si, Ti and Hf.

5. The method of claim 1 wherein the mass consists of aluminum and from about 10 ppm to about 100 ppm of the one or more dopant elements.

6. The method of claim 1 wherein the mass consists of Al and from about 10 ppm to about 100 ppm of one or more of Si, Ti, and Hf.

7. The method of claim 1 wherein the mass consists of Al and from about 10 ppm to about 100 ppm of Hf.

8. The method of claim 1 wherein the mass consists of Al and from about 10 ppm to about 100 ppm of Ti.

9. The method of claim 1 wherein the mass consists of Al and from about 10 ppm to about 100 ppm of Si.

10. A method of forming an aluminum-comprising physical vapor deposition target, comprising:
    deforming an aluminum-comprising mass by equal channel angular extrusion; and
    after the deforming, shaping the mass into at least a portion of a physical vapor deposition target utilizing one or more of forging and rolling of the aluminum comprising mass at a temperature of less than or equal to about 200° C. the physical vapor deposition target having an average grain size less than or equal to 45 microns.

11. The method of claim 10 wherein the mass is formed into an entirety of the physical vapor deposition target, and further comprising mounting the mass to a backing plate.

12. The method of claim 10 wherein the mass is at least 99.99% aluminum and consists of Al and less than 100 ppm of one or more of Si, Sc, Ti and Hf.

13. The method of claim 10 wherein the mass is at least 99.99% aluminum, and further comprises greater than 0 ppm and less than or equal to about 100 ppm of one or more dopant materials comprising elements selected from the group consisting of Ac, Ag, As, B, Ba, Be, Bi, C, Ca, Cd, Ce, Co, Cr, Cu, Dy, Er, Eu, Fe, Ga, Gd, Ge, Hf, Ho, In, Ir, La, Lu, Mg, Mn, Mo, N, Nb, Nd, Ni, O, Os, P, Pb, Pd, Pm, Po, Pr, Pt, Pu, Ra, Rf, Rh, Ru, S, Sb, Sc, Se, Si, Sm, Sn, Sr, Ta, Tb, Te, Ti, Tl, Tm, V, W, Y, Yb, Zn and Zr.

14. The method of claim 10 wherein the mass consists essentially of aluminum.

15. The method of claim 10 wherein the mass consists essentially of aluminum, and less than or equal to about 100 ppm of one or more dopant materials comprising elements selected from the group consisting of Ac, Ag, As, B, Ba, Be, Bi, C, Ca, Cd, Ce, Co, Cr, Cu, Dy, Er, Eu, Fe, Ga, Gd, Ge, Hf, Ho, In, Ir, La, Lu, Mg, Mn, Mo, N, Nb, Nd, Ni, O, Os, P, Pb, Pd, Pm, Po, Pr, Pt, Pu, Ra, Rf, Rh, Ru, S, Sb, Sc, Se, Si, Sm, Sn, Sr, Ta, Tb, Te, Ti, Tl, Tm, V, W, Y, Yb, Zn and Zr.

16. The method of claim 10 wherein the deforming comprises at least three extruding steps, each of the at least three extruding steps comprising passing the mass through two intersecting passages having approximately equal cross-sections.

17. The method of claim 10 wherein the deforming comprises at least four extruding steps, each of the at least four extruding steps comprising passing the mass through two intersecting passages having approximately equal cross-sections.

18. The method of claim 10 wherein the deforming comprises at least six extruding steps, each of the at least six extruding steps comprising passing the mass through two intersecting passages having approximately equal crosssections.

* * * * *

UNITED STATES PATENT AND TRADEMARK OFFICE
CERTIFICATE OF CORRECTION

PATENT NO. : 7,017,382 B2
APPLICATION NO. : 10/194022
DATED : March 28, 2006
INVENTOR(S) : Vladimir M. Segal It is certified that error appears in the above-identified patent and that said Letters Patent is hereby corrected as shown below:

Col. 5, line, 54
Replace "Nos. 5,400,633; 5,513,512; 5,600,989; and 5,590,390. The"
Insert --Nos. 5,400,633; 5,513,512; 5,600,989; and 5,590,389. The--

Col. 7, line, 13
Replace "elements, Group VA elements, Group VIB elements, Group"
Insert --elements, Group VA elements, Group IIIB elements, Group--

Col. 7, line, 20
Replace "Sr, Ta, Tb, Te, Ti, Ti, Tm, V, W, Y, Yb, Zn and Zr."
Insert --Sr, Ta, Tb, Te, Ti, Tl, Tm, V, W, Y, Yb, Zn and Zr.--

Col. 7, line, 59
Replace "greater than 99.99% (4N), alone or doped with less 100 ppm"
Insert --greater than 99.99% (4N), alone or doped with less than 100 ppm--

Col. 8, line, 42
Replace "390. The aluminum-comprising mass can consist of"
Insert --389. The aluminum-comprising mass can consist of--

Col. 13, line, 58
Replace "Therein, and Processed Accordance with"
Insert --Therein, and Processed In Accordance with--

Signed and Sealed this

Third Day of April, 2007

JON W. DUDAS
*Director of the United States Patent and Trademark Office*